(12) United States Patent
Hamada

(10) Patent No.: US 7,019,293 B1
(45) Date of Patent: Mar. 28, 2006

(54) POSITION DETECTING SYSTEM AND METHOD

(75) Inventor: Takehiko Hamada, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/057,455

(22) Filed: Apr. 9, 1998

(30) Foreign Application Priority Data

Apr. 9, 1997 (JP) .................................. 9-090827

(51) Int. Cl.
*H01L 21/66* (2006.01)
*H01J 37/28* (2006.01)

(52) U.S. Cl. ................................. 250/310; 250/491.1
(58) Field of Classification Search ................ 250/310, 250/491.1
See application file for complete search history.

(56) References Cited

U.S. PATENT DOCUMENTS

| | | | | |
|---|---|---|---|---|
| 3,535,516 A | * | 10/1970 | Munakata | 250/310 |
| 4,039,829 A | * | 8/1977 | Kato et al. | 250/310 |
| 4,219,731 A | * | 8/1980 | Migitaka et al. | 250/310 |
| 4,581,534 A | * | 4/1986 | Todokoro et al. | 250/310 |
| 4,600,839 A | * | 7/1986 | Ichihashi et al. | 250/310 |
| 5,703,373 A | * | 12/1997 | Peckerar et al. | 250/491.1 |

FOREIGN PATENT DOCUMENTS

| | | |
|---|---|---|
| JP | 63-308510 | 12/1988 |
| JP | 1-197607 | 8/1989 |
| JP | 2-126108 | 5/1990 |
| JP | 2-140609 | 5/1990 |
| JP | 4-102344 | 4/1992 |
| JP | 4-110709 | 4/1992 |
| JP | 6-20633 | 1/1994 |
| JP | 7-27549 | 1/1995 |
| JP | 7-243835 | 9/1995 |

* cited by examiner

*Primary Examiner*—Jack I. Berman
(74) *Attorney, Agent, or Firm*—Young & Thompson

(57) ABSTRACT

In a position detecting system and method, an electron beam is irradiated to a sample including a portion to be measured, and the electron beam is caused to move in relation to the portion to be measured in the sample. Furthermore, a voltage is applied to the sample which is scanned by the electron beam, and a current flowing in the sample because of the applied voltage, is detected. Thus, the position of the portion to be measured can be determined from a scanning start position of the electron beam and the position where the detected current changes.

1 Claim, 4 Drawing Sheets

POSITION DETECTING SYSTEM AND METHOD

BACKGROUND OF THE INVENTION

1. Field of the Invention

The present invention relates to position detecting system and method, and more specifically to position detecting system and method for detecting the position and the size of a portion to be measured in a sample, such as a wiring pattern and a contact hole in a semiconductor wafer.

2. Description of Related Art

In the prior art, it is known that a secondary electron image of the scanning electron microscope (abbreviated to "SEM") is used in order to detect the size of a portion to be measured in a sample, such as a wiring pattern in a semiconductor wafer. For example, in the case of measuring the line width of the wiring pattern on the semiconductor wafer, an electron beam is irradiated perpendicularly to a surface of the semiconductor wafer and is scanned at a constant speed to cross the wiring pattern. The secondary electrons generated in the above process are detected, and the change of the intensity of the secondary electrons is obtained as a function of the scanning position. Since the intensity of the detected secondary electrons changes at the position of the wiring pattern, the size of the wiring pattern in a measured region can be calculated from the change of the intensity of the detected secondary electrons.

However, when a conducting wiring pattern is scanned with the electron beam, the precision of the detection often lowers because the wiring pattern is electrified or charged. A method for overcoming this problem has been proposed in Japanese Patent Application Pre-examination Publication No. JP-A-01-197607, (the content of which is incorporated by reference in its entirety into this application, and also an English abstract of JP-A-01-197607 is available from the Japanese Patent Office and the content of the English abstract of JP-A-01-197607 is also incorporated by reference in its entirety into this application).

Now, the method proposed by JP-A-01-197607 will be briefly described with reference to FIG. 7, which is a sectional view of a circuit component as a sample to be measured.

The shown circuit component, generally designated with Reference Numeral 100, includes a conducting substrate 101. An insulating film 102 is deposited on a surface of the conducting substrate 101, and a contact hole 103 is formed to penetrate through the insulator film 102. A conducting film 104 is deposited on a surface of the insulating film 102 to contact with the surface of the conducting substrate 101 through the contact hole 103.

In the circuit component 100 thus formed, since the conducting film 104 is electrically connected to the conducting substrate 101 through the contact hole 103 formed in the insulating film 102, even if the surface of the conducting film 104 is scanned with the electron beam in the scanning electron microscope (SEM), the conducting film 104 is in no way electrified. Therefore, the size of the conducting film 104 can be precisely determined from the intensity of the secondary electrons. As mentioned above, since a structure for preventing electrification of the conducting film 104 is realized by the contact hole 103 formed in the insulating film 102, the structure is simple and does not require special equipment for formation of the structure.

Incidentally, when it is required to measure the diameter of the contact hole 103 in the circuit component 100, it is sufficient if, before the conducting film 104 is deposited, the surface of the insulating film 102 is scanned with the electron beam in the scanning electron microscope (SEM) and the generated secondary electrons are detected.

The circuit component 100 formed as mentioned above can make it possible to precisely measure the line width of the conducting film 104 by scanning the electron beam, and also to measure the diameter of the contact hole 103 by the scanning of the electron beam in the process of manufacturing.

However, even if it is easy to detect the position and the diameter of the upper end of the contact hole 103 by the scanning of the electron beam, it is difficult to detect the position and the diameter of the bottom of the hole. The reason for this is that, when the contact hole 103 is deep, even if the electron beam is irradiated, the secondary electrons are not emitted out of the contact hole.

SUMMARY OF THE INVENTION

Accordingly, it is an object of the present invention to provide position detecting system and method, which have overcome the above mentioned defect of the conventional one.

Another object of the present invention is to provide position detecting system and method capable of precisely measure the position and the size of the bottom of a deep contact hole in the circuit component in the process of manufacturing.

The above and other objects of the present invention are achieved in accordance with the present invention by a position detecting system comprising a beam irradiating means for irradiating an electron beam to a sample including a portion to be measured, a beam scanning means for relatively scanning the electron beam so that the electron beam moves in relation to the portion to be measured in the sample, a voltage applying means for applying a voltage to the sample which is scanned by the electron beam, a current detecting means for detecting a current flowing in the sample because of the applied voltage, and a position detecting means for detecting the position of the portion to be measured with reference to a scanning start position of the electron beam and the position when the detected current changes.

With the above mentioned arrangement, the electron beam is applied by action of the beam irradiating means to the sample including the portion to be measured, and the electron beam is scanned in relation to the sample by the beam scanning means so that the electron beam moves on the portion to be measured in the sample. By the voltage applying means, the voltage is applied to the sample which is scanned by the electron beam, and the current flowing in the sample because of the applied voltage is detected by the current detecting means. When the detected current changes, the position of the portion to be measured with reference to the scanning start position of the electron beam can be detected. Therefore, it is possible to measure the diameter of a deep contact hole in the sample, which could not be measured by either the secondary electrons or reflected electrons.

For example, in a circuit component having a contact hole formed to penetrate through an insulating film formed on a surface of a silicon substrate, the electron beam is irradiated onto a surface of the insulating film, and the voltage is applied to the silicon substrate. In this case, the current flows in the circuit component only when the electron beam reaches the silicon substrate through the contact hole. Therefore, it is possible to detect the position of an edge of the contact hole, measured with reference to the scanning start position of the electron beam.

In this invention, the sample includes for example a circuit component, in the process of manufacturing, having an insulating film formed on the surface of the silicon substrate, as mentioned above, and the portion to be measured includes the contact hole formed in the insulating film to reach from the surface of the insulating film to the surface of the silicon substrate. In addition, the relative scanning of the electron beam means that at least one of the sample and the electron beam is moved in the condition that the electron beam is irradiated onto the sample. The position detecting means is sufficient if it can achieve the above mentioned function, and therefore, can be realized by various means including a specialized hardware, a computer installed with a suitable program, and a combination thereof.

In a variation of the position detecting system in accordance with the present invention, the position detecting means detects the position of the portion to be measured with reference to the scanning start position of the electron, on the basis of the scanning start time of the electron beam and the time the detected current changes. In this case, the position detecting means compare the detected current changing time (or moment) with the scanning start time (or moment) of the electron beam, to determine the position of the portion to be measured with reference to the scanning start position of the electron beam. Therefore, for example, the position of the edge of the contact hole is detected on the basis of the detected current changing time. Namely, the position of the portion to be measured can be precisely determined with a simple arithmetic operation.

In another variation of the position detecting system in accordance with the present invention, it includes a size measuring means for measuring the size of the portion to be measured, on the basis of a difference in the coordinates between two positions detected by the position detecting means. In this case, since the size of the portion to be measured is measured by the size measuring means on the basis of a difference in the coordinates between the two positions detected by the position detecting means, it is possible to measure for example the diameter of the contact hole which the electron beam is scanned to cross. Therefore, the size of the portion to be measured can be precisely determined with a simple arithmetic operation.

In still another variation of the position detecting system in accordance with the present invention, it includes a size measuring means for measuring the size of the portion to be measured, by multiplying a scanning speed of the electron beam by the time during which the current is at a changed level. Since the size of the portion to be measured is measured by the size measuring means by multiplying the scanning speed of the electron beam by the time during which the current is at the changed level, the size of the portion to be measured can be also measured by a simple arithmetic processing.

In a further variation of the position detecting system in accordance with the present invention, the voltage applying means periodically changes the voltage applied to the sample. Since the voltage applied to the sample by the voltage applying means periodically changes, even if a DC current does not flow in the sample, it is possible to detect the position and the size of the portion to be measured, such as the position and the size of the bottom of the contact hole, from the change of the magnitude of the periodically changing current flowing through the sample. Here, the periodically changing voltage includes an AC voltage and a pulse voltage.

In a still further variation of the position detecting system in accordance with the present invention, there is provided an electron detecting means for detecting at least one of the secondary electrons and the reflected electron from the sample. In addition, there is provided a conventional measuring means for measuring the size of the portion to be measured on the basis of the scanning start position of the electron beam and the position when the amount of the detected electrons changes. Therefore, it is possible to measure the size of the portion to be measured in which the current caused by the voltage applied to the sample does not change regardless of the scanning of the electron beam. Accordingly, since the detection of the surface by the secondary or reflected electrons can be utilized in combination with the determination by the change of the detected current, it is possible to determine the position and the size of various portions to be measured.

According to another aspect of the present invention, there is provided a position detecting method comprising the step of irradiating an electron beam to a sample including a portion to be measured, relatively scanning the electron beam to cause the electron beam to move in relation to the portion to be measured in the sample, applying a voltage to the sample which is scanned by the electron beam, detecting a current flowing in the sample because of the applied voltage, and detecting the position of the portion to be measured with reference to a scanning start position of the electron beam and the position where the detected current changes.

For example, in a circuit component having a contact hole formed to penetrate through an insulating film formed on a surface of a silicon substrate, the electron beam is irradiated onto a surface of the insulating film, and the voltage is applied to the silicon substrate. In this case, since the current flows in the circuit component only when the electron beam reaches the silicon substrate through the contact hole, it is possible to detect the position of an edge of the contact hole, measured with reference to the scanning start position of the electron beam.

In a variation of the position detecting method in accordance with the present invention, the position of the portion to be measured is determined with reference to the scanning start position of the electron, on the basis of the scanning start time (or moment) of the electron beam and the detected current changing time (or moment). Therefore, for example, the position of the edge of the contact hole is detected on the basis of the detected current changing time. Thus, the position of the portion to be measured can be precisely determined with a simple arithmetic operation.

In another variation of the position detecting method in accordance with the present invention, the size of the portion to be measured is determined on the basis of a difference in the coordinates between two positions detected by the position detecting means. In this case, it is possible to measure for example the diameter of the contact hole which the electron beam is scanned to cross, on the basis of a difference in the coordinates between two edges detected. Therefore, the size of the portion to be measured can be precisely determined with a simple arithmetic operation.

In still another variation of the position detecting method in accordance with the present invention, the size of the portion to be measured is determined by multiplying a scanning speed of the electron beam by the time during which the current is at a changed level. Therefore, the size of the portion to be measured can be also measured by a simple arithmetic processing.

In a further variation of the position detecting method in accordance with the present invention, the voltage applied to the sample is caused to periodically change. Since the voltage applied to the sample by the voltage applying means periodically changes, even if a DC current does not flow in the sample, it is possible to detect for example the position and the size of the bottom of the contact hole, from the change of the magnitude of the periodically changing current flowing through the sample.

In a still further variation of the position detecting method in accordance with the present invention, at least one of the secondary electrons and the reflected electron from the sample, is detected, and the size of the portion to be measured is measured on the basis of the scanning start position of the electron beam and the position when the amount of the detected electrons changes. Therefore, it is possible to measure the size of the portion to be measured in which the current caused by the voltage applied to the sample does not change regardless of the scanning of the electron beam. Accordingly, since the detection of the surface by the secondary or reflected electrons can be utilized in combination with the determination by the change of the detected current, it is possible to determine the position and the size of various portions to be measured.

The above and other objects, features and advantages of the present invention will be apparent from the following description of preferred embodiments of the invention with reference to the accompanying drawings.

DESCRIPTION OF THE PREFERRED EMBODIMENTS

Figure 1:
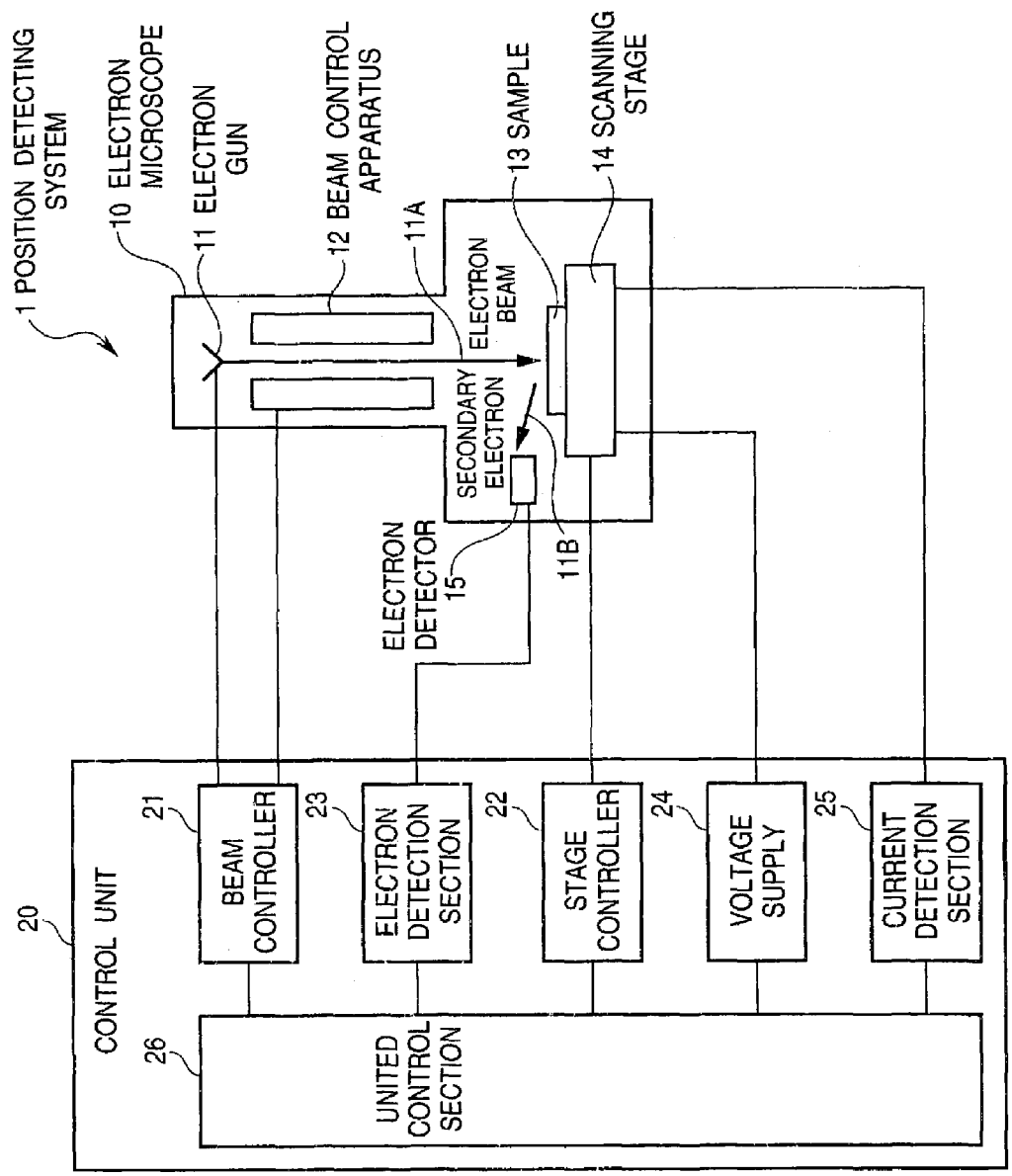
FIG. 1 is a block diagram of an embodiment of the position detecting system in accordance with the present invention.

Referring to FIG. 1, there is shown a block diagram of an embodiment of the position detecting system in accordance with the present invention.

The position detecting system in accordance with the present invention is generally designated by Reference Numeral 1, and includes a scanning electron microscope (SEM) 10 and a control unit 20 which is constituted of a computer system.

The electron microscope 10 includes an electron gun 11 for emitting an electron beam 11A, and a beam control apparatus 12 is located in a path of the electron beam 11A emitted from the electron gun 111. This beam control apparatus 12 includes a condenser lens, a scan coil, a deflector, an object lens and a aperture (all of which are not shown since those are well known to persons skilled in the art) in order to control the electron beam 11A. At a position bombarded with the electron beam 11A, a scan stage 14 for holding a sample 13 thereon is movably located. At a position opposing the sample 13 held on the scan stage 14, an electron detector 15 is located to detect secondary electrons 11B from the sample 13.

On the other hand, the control unit 20 is constituted of a computer system connected to necessary means. The control unit 20 includes a beam controller 21, a stage controller 22, an electron detection section 23, a voltage supply 24 for applying a voltage, a current detection section 25 constituting the current detecting means, and a united control section 26 coupled to these various means 21 to 25, which are also connected to corresponding parts of the electron microscope 10.

The beam controller 21 is connected to the electron gun 11 and the beam control apparatus 12, to cause the electron gun 11 to emit the electron beam 11A, and to cause the beam control apparatus 12 to adjust the shape of the beam 11A and the irradiated area of the beam 11A. The stage controller 22 is connected to a driving unit (not shown) for the scanning stage 14, to control the position of the scanning stage 14 in order to cause the electron beam 11A to be irradiated onto a desired position of the sample 13 held on the stage 14. The electron detection section 23 is connected to the electron detector 15, to receive a secondary electron detection signal from the electron detector 15 and to generate a profile signal.

The voltage supply 24 and the current detection section 25 are connected to the scanning stage 14. The scanning stage 14 is so configured to have a structure electrically connected to a rear surface of the sample 13 held on the stage 14. Therefore, the voltage supply 24 applies the voltage to the sample 14 through the scanning stage 13, and the current detection section 25 detects a current flowing in the sample 13 through the scanning stage 14.

The united control section 26 systematically controls the above mentioned various means 21 to 25.

Thus, the united control section 26 systematically controls the various means 21 to 25, and the various means 21 to 25 control the operation of various parts in the electron microscope 10, with the result that various functions of the position detecting system 1 in accordance with the embodiment of the present invention can be realized.

Namely, the position detecting system 1 in accordance with the embodiment of the present invention includes a beam irradiating means, a beam scanning means, an electron detecting means, a conventional measuring means, a position detecting means, and a size determining means.

The beam irradiating means is constituted of the electron gun 11, the beam control apparatus 12 and the beam controller 21, and irradiates the electron beam onto the sample 13. The beam scanning means is constituted of the scanning stage 14 and the stage controller 22, and relatively scans the electron beam in relation to the sample so that the electron beam moves on the surface of the sample.

The electron detecting means is constituted of the electron detector 15 and the electron detection section 23, and detects the secondary electrons 11B emitted from the sample 13. The conventional measuring means corresponds to one of various functions of the control unit 20, and determines the distance from the scanning start position of the electron beam to the position of a portion to be measured when the amount of the detected secondary electrons changes.

The position detecting means and the size determining means correspond to ones of the various functions of the control unit 20, respectively. The position detecting means detects, from an output of the stage controller 22, the relative position of the electron beam in relation to the sample 13 when the current detected by the current detection section 25 changes, and determines the position of the portion to be measured in the sample. More specifically, since the scanning stage 14 is controlled by the stage controller 22 to move at a predetermined constant speed from a predetermined initial position, the position detecting means detects the position of the portion to be measured, from the scanning start time and the time of the change of the detected current.

The size determining means determines the size of the portion to be measured, from a difference in coordinates between two positions detected by the position detecting means. For example, when the portion to be measured in the sample 13 is a contact hole formed in a circuit component, if the electron beam is linearly scanned to pass through the center of the contact hole, the diameter of the contact hole can be obtained by calculating the difference between respective detected positions of a pair of edges.

Figure 2:
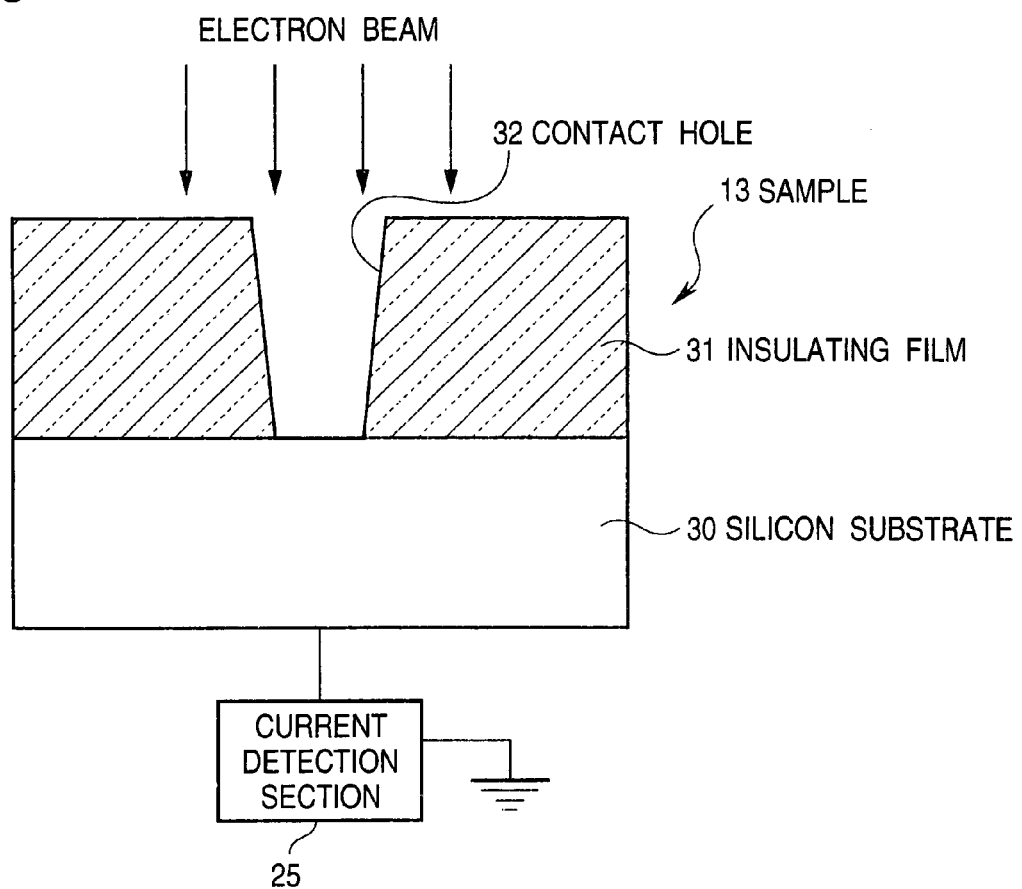
FIG. 2 is a diagrammatic sectional view of a first example of the sample measured in the position detecting system in accordance with the present invention.

For example, as shown in FIG. 2, the sample 13 includes a p-type silicon substrate 30 having an insulating film 31 formed of a silicon oxide film having the thickness of 1 μm, deposited on a surface of the substrate 30 and a contact hole 32 having the diameter of about 0.4 μm, formed to penetrate through the insulating film 31 to reach from a surface of the insulating film 31 to the surface of the substrate 30.

Now, the position detecting method will be described by use of the position detecting system 1 having the above mentioned construction.

For example, in the case of detecting or measuring the position and the line width of a wiring pattern formed on the surface of the sample 13, the electron bean 11A emitted from the electron gun 11 is controlled by the beam control apparatus 12 to be irradiated onto the surface of the sample 13, and on the other hand, the sample 13 is moved together with the scanning stage for the scanning. Therefore, the surface of the sample 13 is scanned with the electron beam 11A. On the other hand, since the secondary electrons 11B are generated, the secondary electrons are detected by the electron detector 15 so that the detection signal of the secondary signal is supplied to the united control section 26. Thus, the united control section 26 determines the position and the line width of the wiring pattern formed on the surface of the sample, from the scanning time and the time the detection signal of the secondary signal changes.

However, as mentioned hereinbefore, when a deep contact hole 32 is formed in the sample 13, even if the electron beam 11A is irradiated to the upper surface of the sample in a direction perpendicular to the upper surface of the sample, since the secondary electrons emitted from the bottom of the contact hole cannot go out of the contact 32, it is difficult to determine the position and the diameter of the bottom of the contact hole 32 by use of the secondary electrons. In this case, the position detecting system 1 in the shown embodiment determines the position and the diameter of the bottom of the contact hole 32, on the basis of the change of the detected current, without utilizing the secondary electrons.

More specifically, when the surface of the sample 13 is scanned with the electron beam 11A, the voltage of for example +3 V is applied to the bottom of the sample 13 from the voltage supply 24, and the current flowing in the sample 13 is detected from the bottom of the sample 13 by means of the current detection section 25. As a result, when the electron beam 11A is bombarded onto the surface of the insulating film 31, a current does not flow in the silicon substrate 30, but when the electron beam 11A is bombarded onto the bottom of the contact hole 32 (namely, the surface of the silicon substrate 30 through the contact hole 32), a current flows in the silicon substrate 30.

Figure 3:
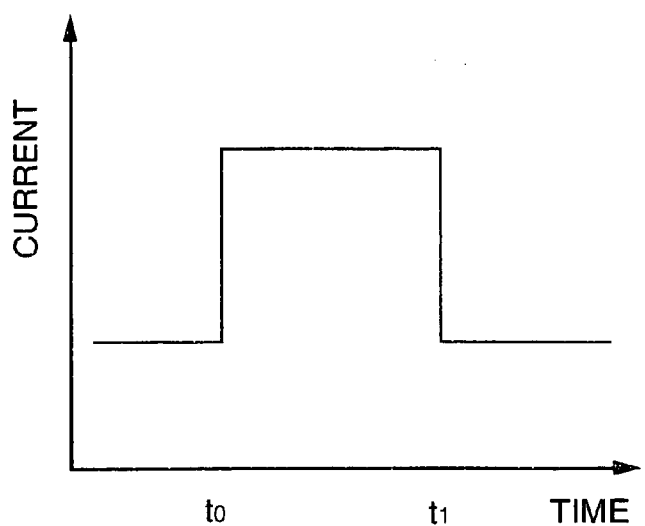
FIG. 3 is a waveform diagram illustrating one example of the result of the current detection in the position detecting system in accordance with the present invention.

In this case, the waveform of the current detection signal outputted from the current detection section 25 changes with time, as shown in FIG. 3. Therefore, the position and the diameter of the bottom of the contact hole 32 are determined on the basis of the times the detected current value changes. In FIG. 3, since times $t_0$ and $t_1$ correspond to edge positions of the bottom of the contact hole 32, the coordinates of the edge positions of the bottom of the contact hole 32 can be obtained by multiplying these times by a scanning speed "v" and adding the result of the multiplication to the coordinate "a" of the initial position. Namely, "$a+vt_0$" and "$a+vt_1$" are obtained. In addition, the diameter of the bottom of the contact hole can be determined by calculating the difference between the obtained coordinates of the edge positions. If it is not necessary to determine the position, the diameter of the bottom of the contact hole can be determined by multiplying the difference between the times by a scanning speed "v". Namely, "$v(t_0-t_1)$" is obtained.

As seen from the above, the position detecting system 1 in the shown embodiment can determine the position and the diameter of the contact hole 32 in the sample 13, which can be hardly detected by the secondary electrons. In addition, the determination can be carried out by a very simple arithmetic operation. Furthermore, since the detection of the surface by the secondary electrons can be utilized in combination with this determination, it is possible to determine the position and the size of various parts including the wiring pattern and the contact hole 32 in the sample 13, regardless of the positional relation between the wiring pattern and the contact hole.

Incidentally, it would be a matter of course to persons skilled in the art that, in the position detecting system 1, the scanning speed "v" of the electron beam, an accelerating voltage of the electron beam, a beam current, a beam diameter, the voltage applied to the sample are to be optimized by considering the size and the density of the portion to be measured.

Furthermore, the present invention is in no way limited to the details of the above mentioned embodiment, but changes and modifications may be made within the scope of the spirit of the invention.

In the above mentioned embodiment, the constant voltage is applied to the sample 13 from the voltage supply 24. However, for example, the voltage applied to the sample can be caused to periodically change.

For example, when a DC current does not flow in the sample, as in the case that a thin oxide film is formed on the upper or lower surface of the wafer, and as in the case that the contact hole is formed in an n-type or p-type wafer, the voltage applied to the sample is periodically changed in the form of an AC voltage or a pulsed voltage. As a result, similarly to the above mentioned example, the position and the diameter of the bottom of the contact hole can be determined by detecting an effective current of the periodically changing current flowing in the sample.

Furthermore, in the above mentioned example, the silicon substrate 30 having its surface covered with the insulating film 31 and the contact hole 32 formed in the insulating film 31 is used as the sample 13, and the position and the diameter of the bottom of the contact hole 32 are determined as the portion to be measured. However, the position detecting system can be used to detect various parts in various samples.

Figure 4:
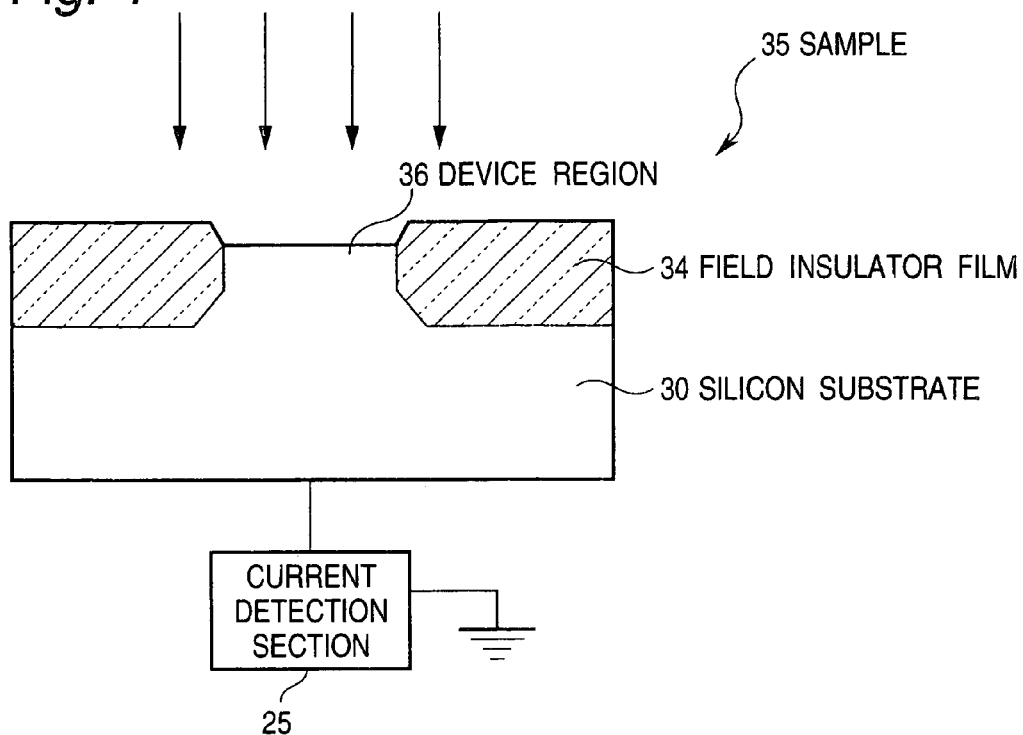
FIG. 4 is a diagrammatic sectional view of a second example of the sample measured in the position detecting system in accordance with the present invention.

For example, as shown in FIG. 4, a sample 35 can be a p-type silicon substrate 30 having a field insulator film 34 of a silicon thermal oxidized film having the thickness of 500 nm, partially formed on the surface of the silicon substrate to confine a device region 36 on the surface of the silicon substrate. In this case, the device region 36 is measured as the portion to be measured. Incidentally, the field insulator film 34 can be formed by selectively oxidizing the surface of the silicon substrate 30.

As shown, when a step difference on the surface of the sample 35 is very small, it is difficult to determine the position and the width of the device region 36 by the prior art method utilizing the secondary electrons. Therefore, in this case, the voltage of +3 V is applied to the silicon substrate 30 in the position detecting system 1, and the change of the current is detected while relatively scanning the electron beam. As a result, the current flows in the silicon substrate 30 only when the electron beam is bombarded to the device region 36. Therefore, the position and the width of the device region 36 can be determined, similarly to the above mentioned example.

Figure 5:
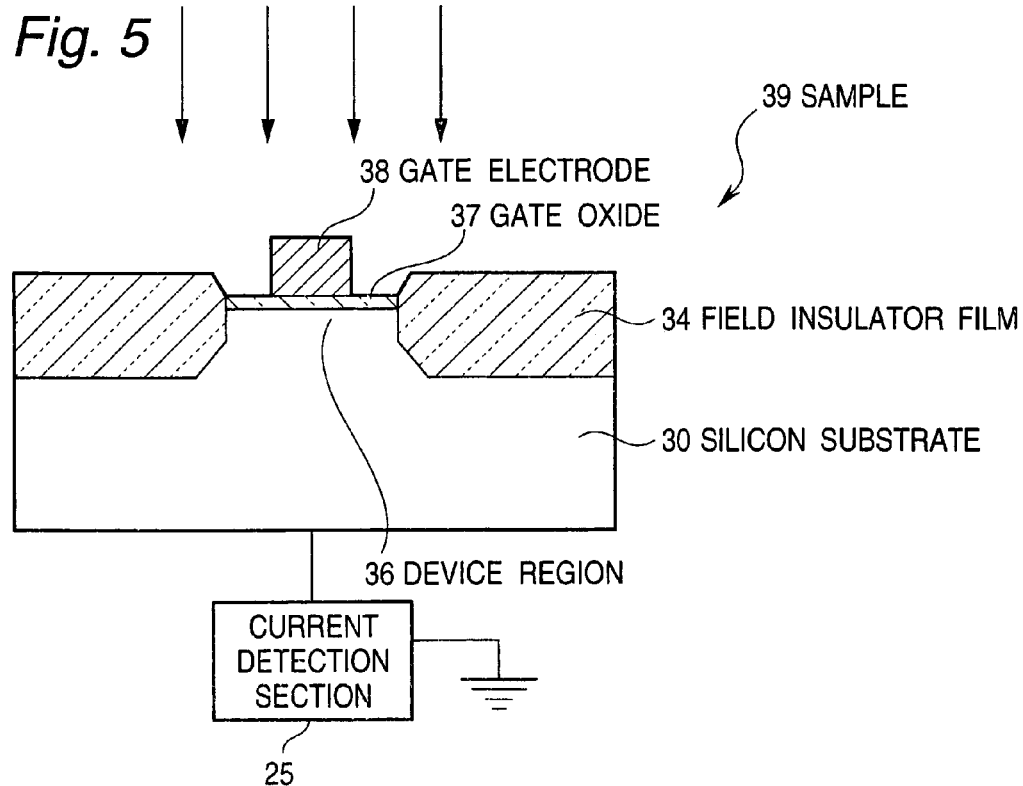
FIG. 5 is a diagrammatic sectional view of a third example of the sample measured in the position detecting system in accordance with the present invention.

Alternatively, as shown in FIG. 5, a sample 39 can additionally includes a gate oxide film 37 formed on the device region 36 of the sample 35 and a gate electrode 38 formed on the gate oxide film 37. In this case, the position and the line width of the gate electrode 38 is measured as the portion to be measured. For example, this sample 39 can be formed by forming the gate oxide film 37 having the thickness of about 15 nm, on the device region 36 of the sample 35, by means of a thermal oxidation, and then, forming on the whole surface a conducting layer having the thickness of about 200 nm and formed of an n-type polysilicon and a tungsten silicide, and thereafter, patterning the conducting layer.

Figure 6:
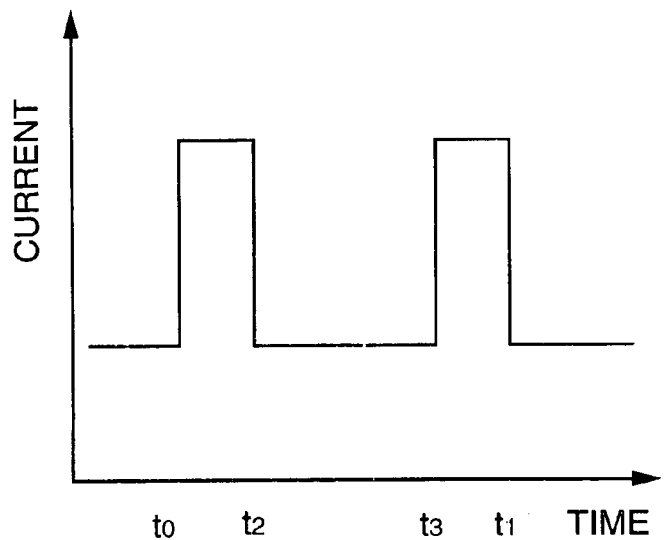
FIG. 6 is a waveform diagram illustrating another example of the result of the current detection in the position detecting system in accordance with the present invention.
Figure 7:
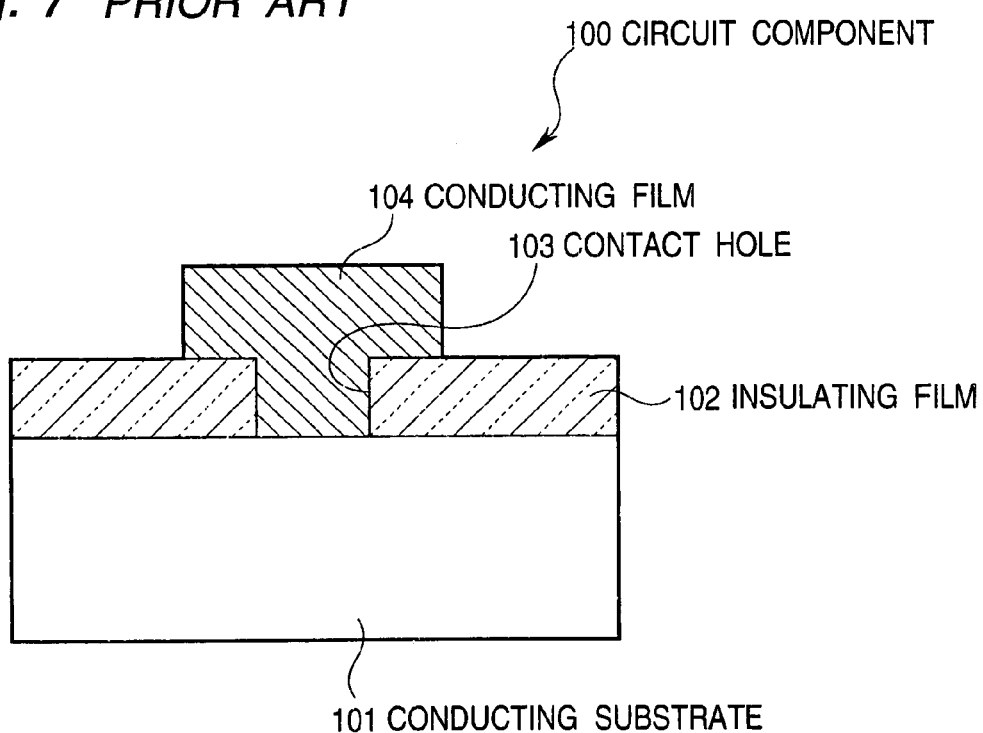
FIG. 7 is a diagrammatic sectional view of the sample measured in the prior art position detecting system.

In the case, the voltage of +3 V is applied to the silicon substrate 30 in the position detecting system 1, and the change of the current is detected while relatively scanning the electron beam. Since the gate oxide film 37 is very thin, the electron beam pass through the gate oxide film 37. As a result, the current flows in the silicon substrate 30 only when the electron beam is bombarded to the device region 36 other than the gate electrode 38. Namely, as shown in FIG. 6, the current can be detected only from the time $t_0$ to $t_2$ and from the time $t_3$ to $t_1$. Therefore, the position and the size of the gate electrode 38 and the device region 36 can be determined, similarly to the above mentioned example.

As seen from the above, according to the position detecting system and method in accordance with the present invention, it is possible to measure or determine the position and the size of the portion to be measured, as the bottom of the deep contact hole, which could not be measured in the prior art method using the secondary electrons or the reflected electrons.

The invention has thus been shown and described with reference to the specific embodiments. However, it should be noted that the present invention is in no way limited to the details of the illustrated structures but changes and modifications may be made within the scope of the appended claims.

What is claimed is:

1. A position detecting system for detecting a position of a bottom of a contact hole in a circuit component having said contact hole through an insulating film on a surface of a silicon substrate, the system comprising a beam irradiating means for irradiating an electron beam toward said surface of said silicon substrate, a beam scanning means for relatively scanning said electron beam so that said electron beam moves in relation to said surface of said silicon substrate, a voltage applying means for applying a voltage to a rear surface of said silicon substrate which is scanned by said electron beam, so that when said electron beam is bombarded onto a surface of said insulating film, an electric current does not flow in said silicon substrate, but when said electron beam is bombarded onto said surface of said silicon substrate through said contact hole, an electric current flows in said circuit component as the result of said electron beam that flows as said electric current through said silicon substrate to said voltage applying means because of the voltage applied to said rear surface of said silicon substrate, a current detecting means for detecting said electric current flowing in said circuit component, at said rear surface of said silicon substrate, and a position detecting means for detecting the position of the bottom of said contact hole, with reference to the scanning start position of said electron beam and the position when the detected current changes, the position of the bottom of said contact hole being detected without detecting secondary electrons and reflected electrons, wherein the system is configured to further detect the position of a gate electrode on a gate oxide film covering a device region confined in said surface of said silicon substrate, wherein when said electron beam is bombarded onto said gate electrode, said electric current does not flow in said silicon substrate, but when said electron beam is bombarded onto said gate oxide film, since said gate oxide film is very thin, said electric current flows in said circuit component as the result of said electron beam that flows as said electric current through said gate oxide film, said device region and said silicon substrate to said voltage applying means because of the voltage applied to said rear surface of said silicon substrate, so that said position detecting means can determine the position of said gate electrode and said device region.

* * * * *